United States Patent [19]
Guillaume

[11] 3,984,849
[45] Oct. 5, 1976

[54] PHOTOGRAPHIC COLOR SEPARATION EQUIPMENT

[75] Inventor: Emile Armand Henri Guillaume, Ballaigues, Switzerland

[73] Assignee: Zelacolor Systems Establishment, Vaduz, Liechtenstein

[22] Filed: Aug. 27, 1974

[21] Appl. No.: 501,187

[30] Foreign Application Priority Data
Aug. 28, 1973 Switzerland.................... 12337/73

[52] U.S. Cl................................ 354/100; 354/212; 355/32
[51] Int. Cl.².................................... G03B 33/00
[58] Field of Search................... 354/100, 210, 212; 355/32

[56] References Cited
UNITED STATES PATENTS

| | | | |
|---|---|---|---|
| 1,051,591 | 1/1913 | Huebner | 354/100 |
| 2,439,112 | 4/1948 | Teague | 354/210 |
| 2,531,376 | 11/1950 | Langdon | 354/210 |
| 2,546,540 | 3/1951 | Gruben | 354/210 |
| 3,058,407 | 10/1962 | Schotthoefer | 354/210 |

Primary Examiner—John Gonzales
Attorney, Agent, or Firm—Ostrolenk, Faber, Gerb & Soffen

[57] ABSTRACT

An apparatus is disclosed for recording color separations on a photographic film band. The apparatus comprises a feed mechanism having a film transport member arranged to selectively bring portions of the unexposed film from a feed spool mounted in a housing into an operative position for exposure in a camera adapted to receive selective filters for color separation. The feed mechanism is arranged to unreel the unexposed film band under constant tension from the feed spool and to displace selected film portions in contact with a support surface whereby to selectively bring these film portions into their operative position for exposure in the camera and return them to said housing after exposure.

16 Claims, 11 Drawing Figures

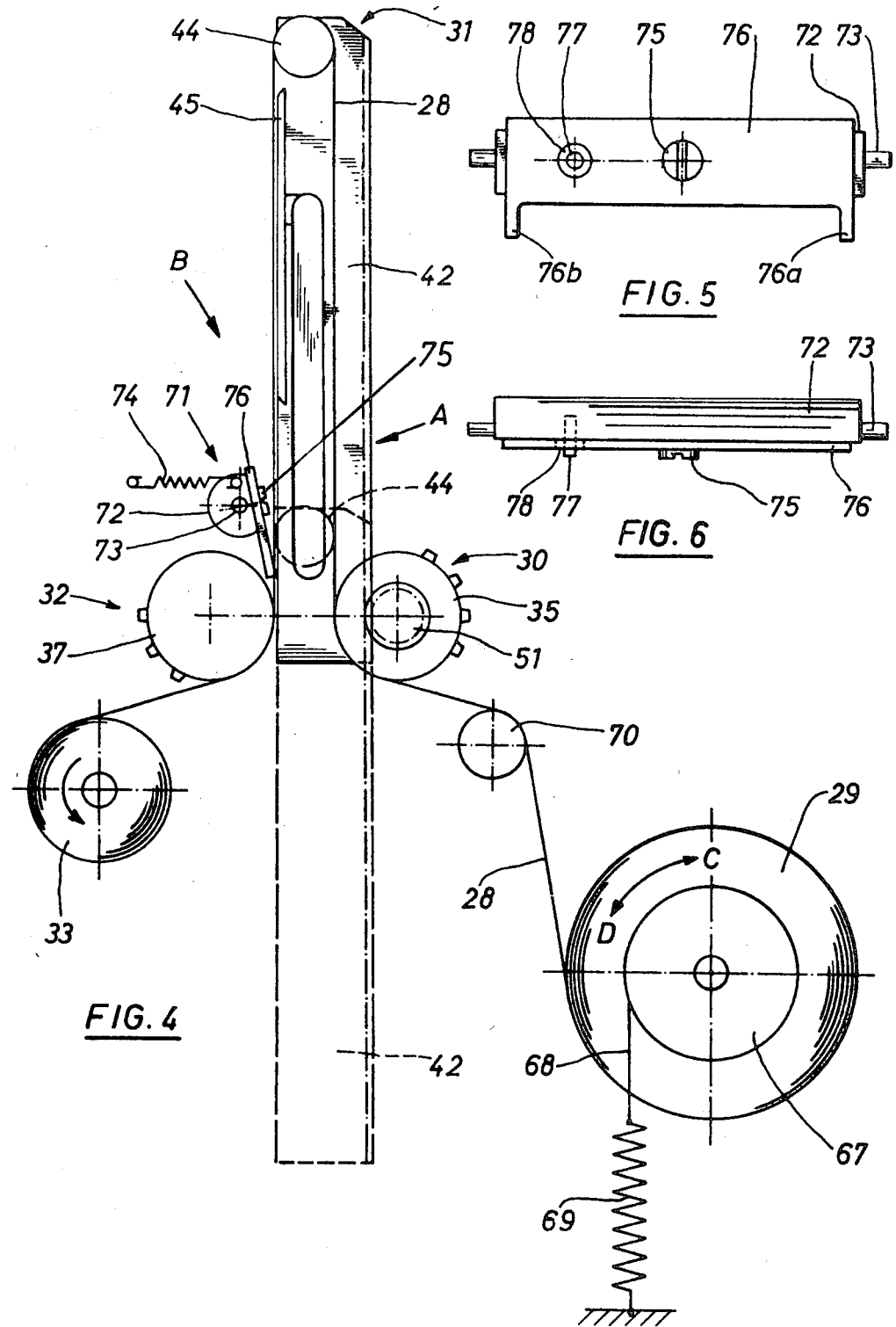

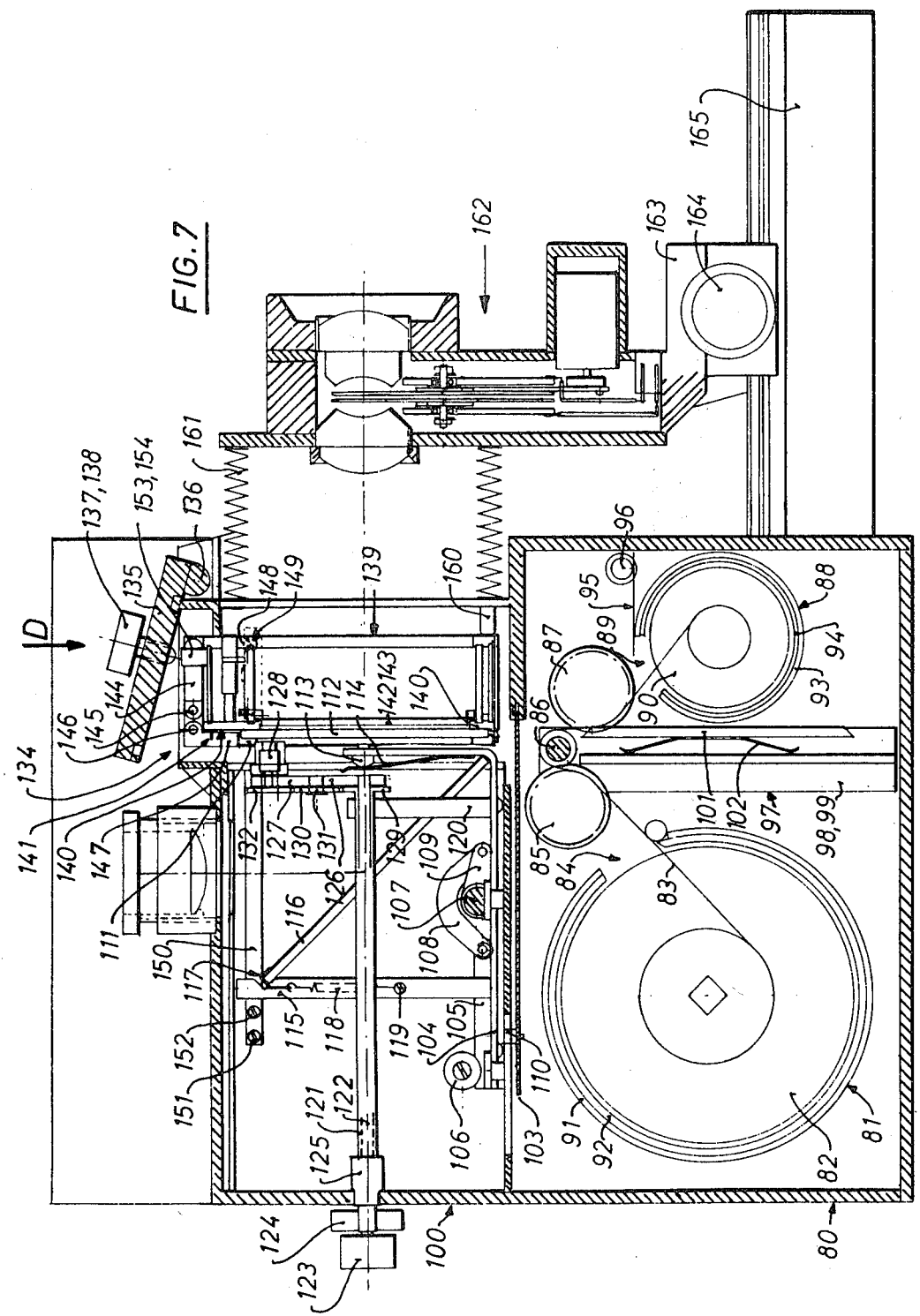

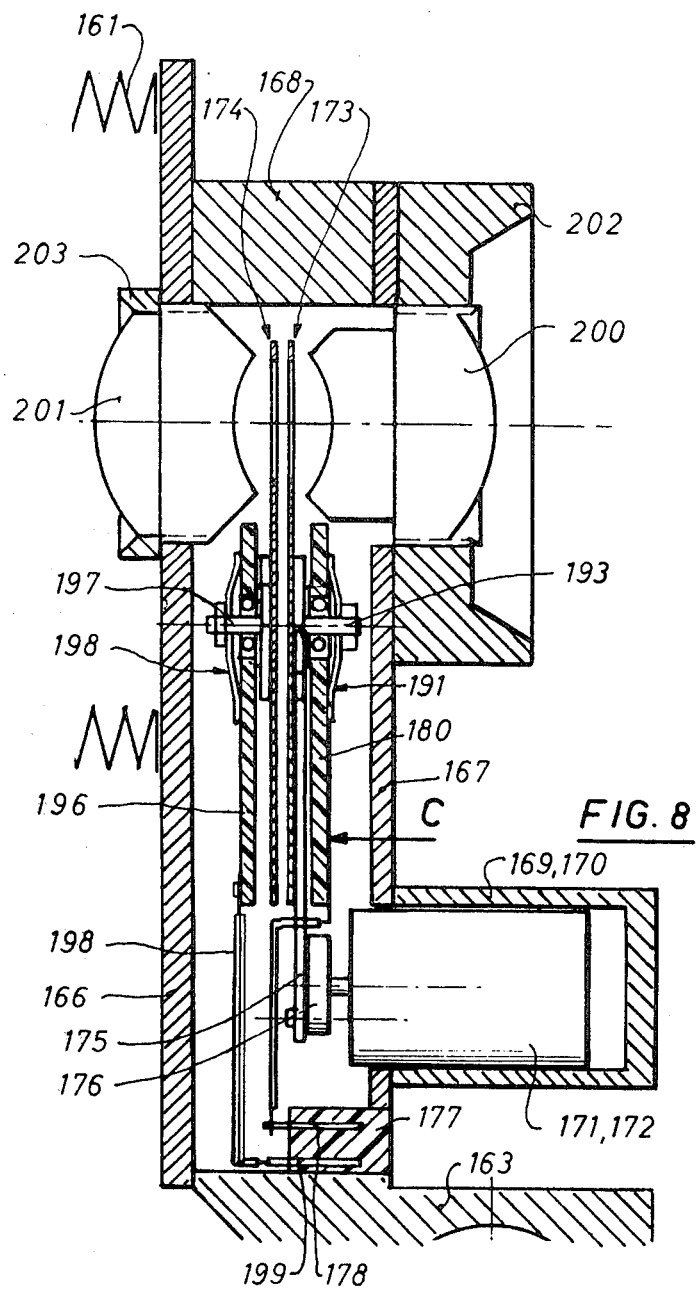

PHOTOGRAPHIC COLOR SEPARATION EQUIPMENT

This invention relates generally to the reproduction of photographic colour prints and in particular to improved means for obtaining colour separations from a transparent colour film or a real subject.

A broad variety of equipment ranging from a small table projector to a large installation occupying a large room is presently available to the professional man for carrying out colour separations. However, this equipment generally presents various important practical drawbacks, namely:

the equipment may only be utilized in a dark room;

an operator must manually effect all settings of the photographic equipment to obtain register and these manipulations consume a considerable amount of time;

the choice of filters to be utilized for selective colour separation is left to the judgement of the operator who must manually place and position these filters and the photographic films in the dark, which is consequently both difficult and time consuming;

a great deal of skill and much time in order to obtain colour separations of high quality whereby the reproduction costs of colour prints are correspondingly high.

A main object of the present invention is to largely obviate the above mentioned drawbacks of the equipment presently available.

A further object of the invention is to provide an apparatus which may be utilized in daylight and can ensure proper register and correct alignment along the optical axis of the photographic system, without necessitating any manipulations by hand.

Another object of the invention is to provide an apparatus which enables automatic control of positioning of the filters, adjustment of the exposure time and advance of the photographic film after each separation has been carried out.

The present invention provides, in an apparatus for recording images on a photographic film band, the improvements consisting of:

a. housing means enclosing a feed-spool and a take-up spool arranged to allow displacement of said film band in a general feed direction and comprising an opening for passage of said film;

b. a feed mechanism, mounted between said feed and take-up spools, comprising a film transport member arranged for lateral displacement with respect to said general feed direction, through said opening, between a position of rest in said housing means and an operative position outside said housing means;

c. support means associated with said transport member and adapted to support selected portions of said film band during said displacement;

d. said feed mechanism being adapted to unreel said film band from said feed spool while maintaining said film band under constant tension and to maintain each of said selection portions in contact with said support means during said displacement, the whole arrangement being such as to allow each portion of the unexposed film band to be selectively extracted from said housing means via said opening, to be displaced to said operative position for exposure thereof in a camera whereby to provide the desired photographic recording, and to allow each portion bearing a recording to be returned to said rest position for transfer to said take-up spool.

The present invention also provides an apparatus for photographic recording from transparent colour film or a real subject, comprising:

a. a camera including an optical system for image projection along an optical axis and first housing means having a cavity with a first opening adapted to receive selected portions of a photographic film band for exposure thereof perpendicular to said axis;

b. a feed mechanism which is mounted between a film feed spool and a film take-up spool in second housing means having a second opening arranged contiguous to said first opening and which comprises a film transport member arranged for displacement in a direction perpendicular to said optical axis between a position of rest and an operative position wherein said transport member is respectively placed in said second housing means and in said cavity of said first housing means, said transport member including a film support means having a bearing surface and said feed mechanism being arranged in such a manner that said film band is unreeled under constant tension from said feed spool while said selected film portions are maintained in contact with said support means during said displacement whereby said film portions are selectively brought into said operative position to allow exposure thereof in said cavity and are returned to said housing after exposure.

According to a preferred embodiment a feed roller assembly is arranged between the feed spool and the said transport member while a receiving roller assembly is arranged between the transport means and the take-up spool, each of said roller assemblies having a pair of toothed wheels which engage in perporations provided along both edges of the film strip, the toothed wheels of said pair being connected together in such a manner as to allow a slight relative rotation thereof in opposite directions.

With the apparatus according to the invention, the film is unreeled while a selected film portion rests on a bearing surface, without relative movement between said film and said surface, whereby deterioration of the sensitive surface of the film can be avoided.

On the other hand, the fact that the toothed wheels of the rollers can turn in opposite directions by an angle of a few degrees allows a constant and equal tension to be applied to both sides of the film by means of the friction clutch, so that the separations will be exactly in register with respect to the perforations of the film. They may consequently be exactly superimposed without taking any particular precautions.

The drawing shows schematically, as an example, a first embodiment intended to illustrate the operation of an apparatus for photographically producing colour separations on black-and-white film from a colour transparency or from an original in colour, and a further preferred embodiment of the invention. In the drawing:

FIG. 4 is a schematic side view of the feed mechanism of FIG. 2;

FIG. 5 is a topview of a holding member seen in direction of the arrow A in FIG. 4;

FIG. 6 is a topview of the holding member seen in the direction of the arrow B in FIG. 4;

FIG. 7 is a longitudinal section through a preferred embodiment of a device for photographic recording on black-and-white film;

FIG. 8 is an enlarged view of a part of the device of FIG. 7 comprising the objective as well as two discs carrying the filters, various diaphragm openings and the motor for controlling the discs;

Figure 1:
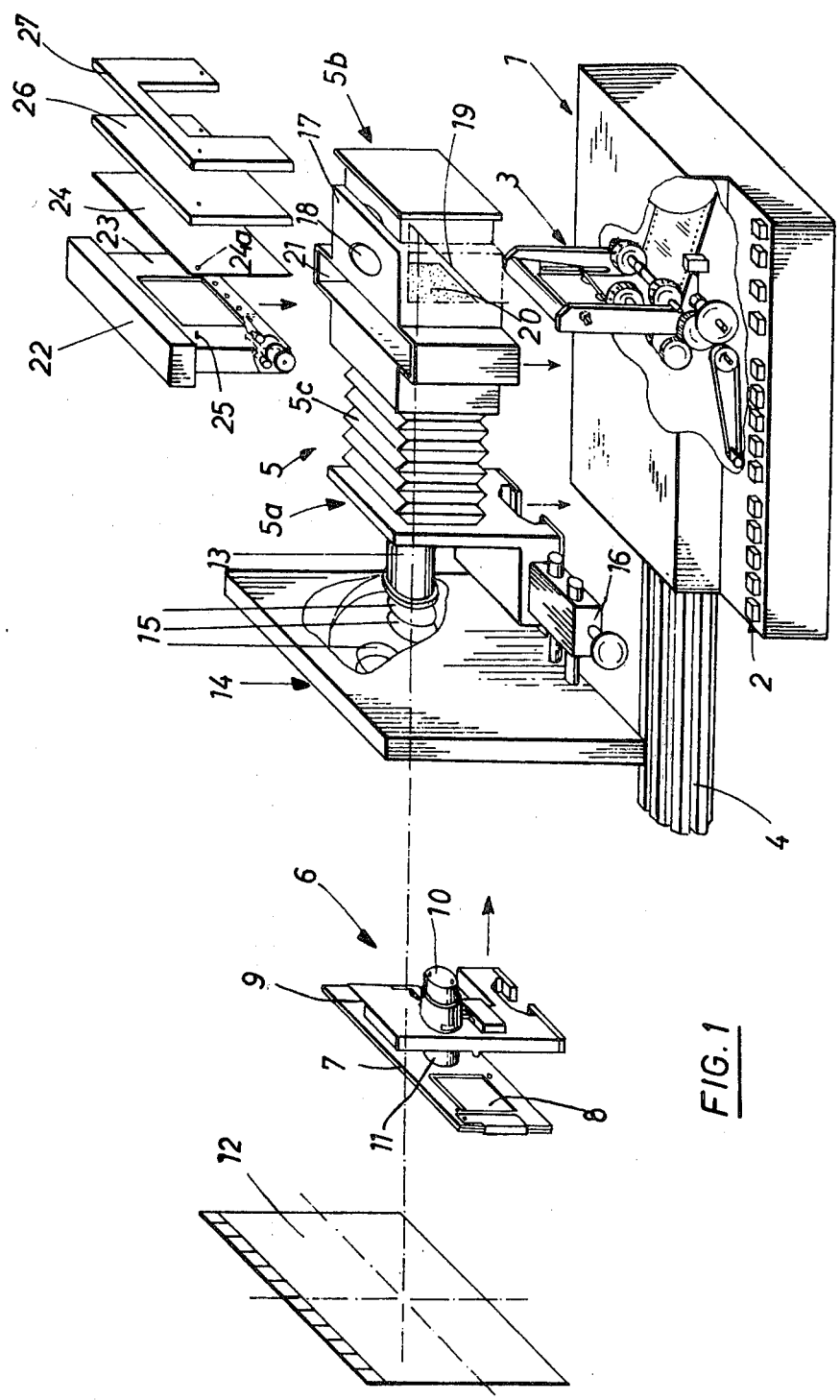
FIG. 1 is an exploded perspective view of the various parts of the first embodiment.

The exploded view of FIG. 1 shows the device for recording selective printing on black-and-white (monochromatic) film, comprising a housing 1 wherein an automatic control system, not shown, is mounted for controlling the operational sequence of the various steps necessary to operate the device. The housing 1 is equipped with a keyboard 2 arranged to allow control of the various desired operating steps. The housing 1 further contains a film band feed mechanism 3 which will be described in greater detail with reference to the FIGS. 2 to 6.

The device further comprises a stand 4 in the form of a massive support having longitudinal grooves carrying an object-holder 6 and a front part (objective) of a camera 5. The object-holder 6 is arranged to allow a colour correction screen to be obtained. The colour correction screen is a mask which is obtained photographically in the form of a black-and-white negative obtained from the subject (contact printing). It is widely used in the graphic arts and its utilization will not be described in detail for that reason. It comprises a frame 7 on which a diapositive 8 to be reproduced is disposed on one side and the colour correction screen 9 is disposed on the other side. The frame 7 is mounted on a shaft 11 driven by motor 10. When the motor 10 is started, the frame 7 turns so as to present one after another the diapositive 8 and the screen 9 to the pencil of rays entering the camera. End switches, not shown in the drawing, are provided for stopping the motor and reversing its direction of rotation. If desired, a support for a transparent original 12 may be mounted on the stand 4 instead of the object-holder 6, so as to present to the camera any transparent original to be reproduced.

The front part 5a of the camera which is slidably mounted on the stand 4 comprises a suitable optical system 14 with a diaphragm. In front of this part 5a, a filter arrangement 14 is mounted which comprises two discs on which various colour separation filters 15 are fixed. These discs each comprise at least one red, green or blue filter and a sighting hole. The optical characteristics of these filters are fully known to the skilled art worker and the filters necessary for obtaining colour separation are commercially available. The filters mounted in the described apparatus are "KODAK" (trademark) gelatine filters. For high quality work, the discs futhermore comprise a magenta filter and/or an olive-green filter for exposure of a mask which will be placed in a casette, itself placed in front of the portion of the film to be exposed, as is described further on. One may evidently add grey filters of different density which will serve to adjust the intensity of the light beam producing an image on the film. The desired filtering may be obtained by the appropriate choice of the types of filters placed in the light beam entering the camera.

The distance between the optical system 13 and the filter arrangement 14 may be chosen by means of an adjusting device 16.

Bellows 5c are placed between the front part 5a and the rear part 5b of the camera 5. The rear part 5b of the camera comprises a viewfinder 17 which is represented very schematically in FIG. 1 and comprises an ocular aperture 18, a mirror 19 and a plate 20 of frosted glass.

A chamber 21 is arranged adjacent to the viewfinder 17, so as to receive a shutter device which is only represented quite schematically in FIG. 1 by the reference number 22.

The shutter device 22 has on its side facing the frosted glass 20 a bearing surface 23 for receiving a mask 24. Set pins 25 are provided on this bearing surface 23 to allow precise positioning of the mask 24 which has perforations 24a corresponding to the set pins 25 of the bearing surface 23.

When the mask 24 is made, the material of the mask which consists of a still unexposed photosensitive material, is placed between the bearing surface 23 and a cover plate 26, the shutter device 22 with the material for the mask and the cover plate 26 being introduced into the chamber 21. After exposure of the photosensitive material of the mask by means of the camera 5, this material is withdrawn from the device 22 and developed. The mask 24 is made from a film mask material specially designed by specialized firms such as KODAK, AGFA, GEVAERT, DUPONT DE NEMOURS, etc. This mask serves to correct the variations in the absorption of various wavelengths by black-and-white films (masking operating).

The developed mask is then put back on the bearing surface 23, the set pins 25 ensuring precise positioning of the mask 24. On the side of the mask 24 opposite to the bearing surface 23 a U-shaped frame 27 is then applied, this frame replacing the cover plate 26 previously used. The mask 24 is thus maintained between the bearing surface 23 and the U-shaped frame 27.

To obtain the colour separations, the shutter device, the mask 24 and the frame 27 will be inserted into the chamber 21 as a single unit.

Figure 2:
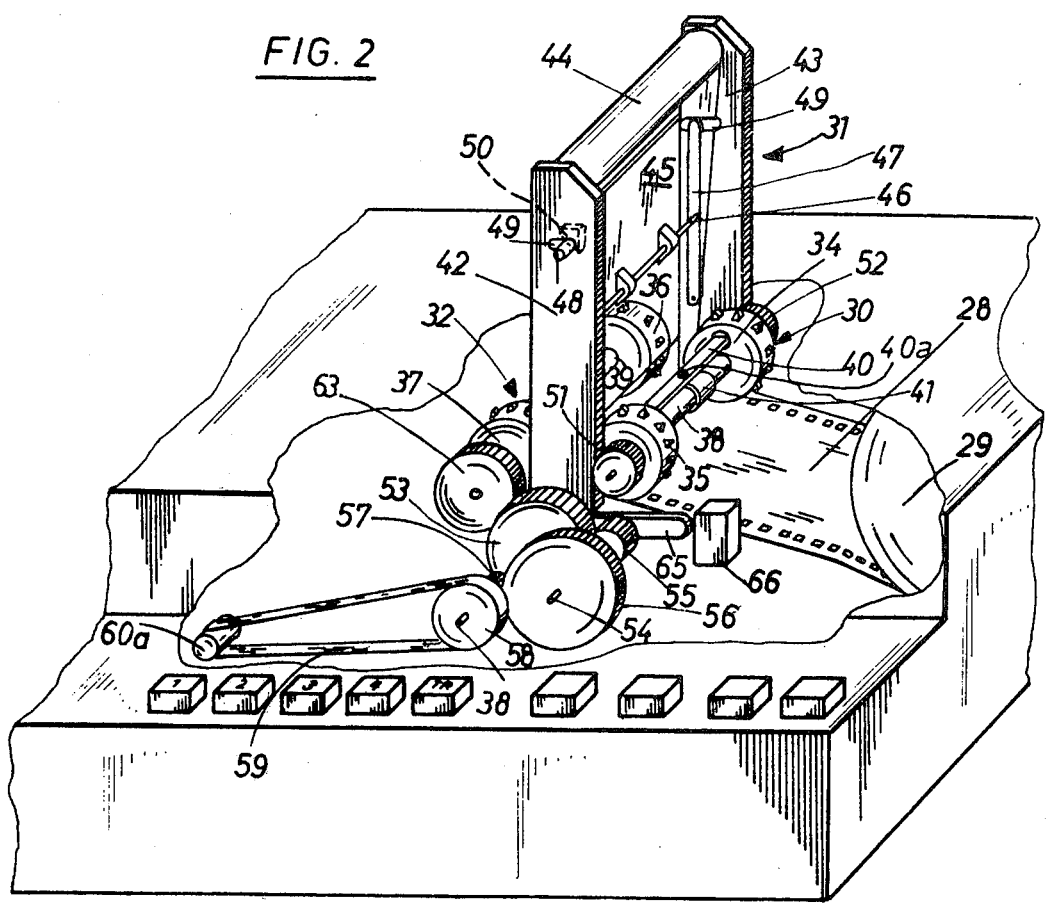
FIG. 2 is a perspective view of a feed mechanism for film band.
Figure 3:
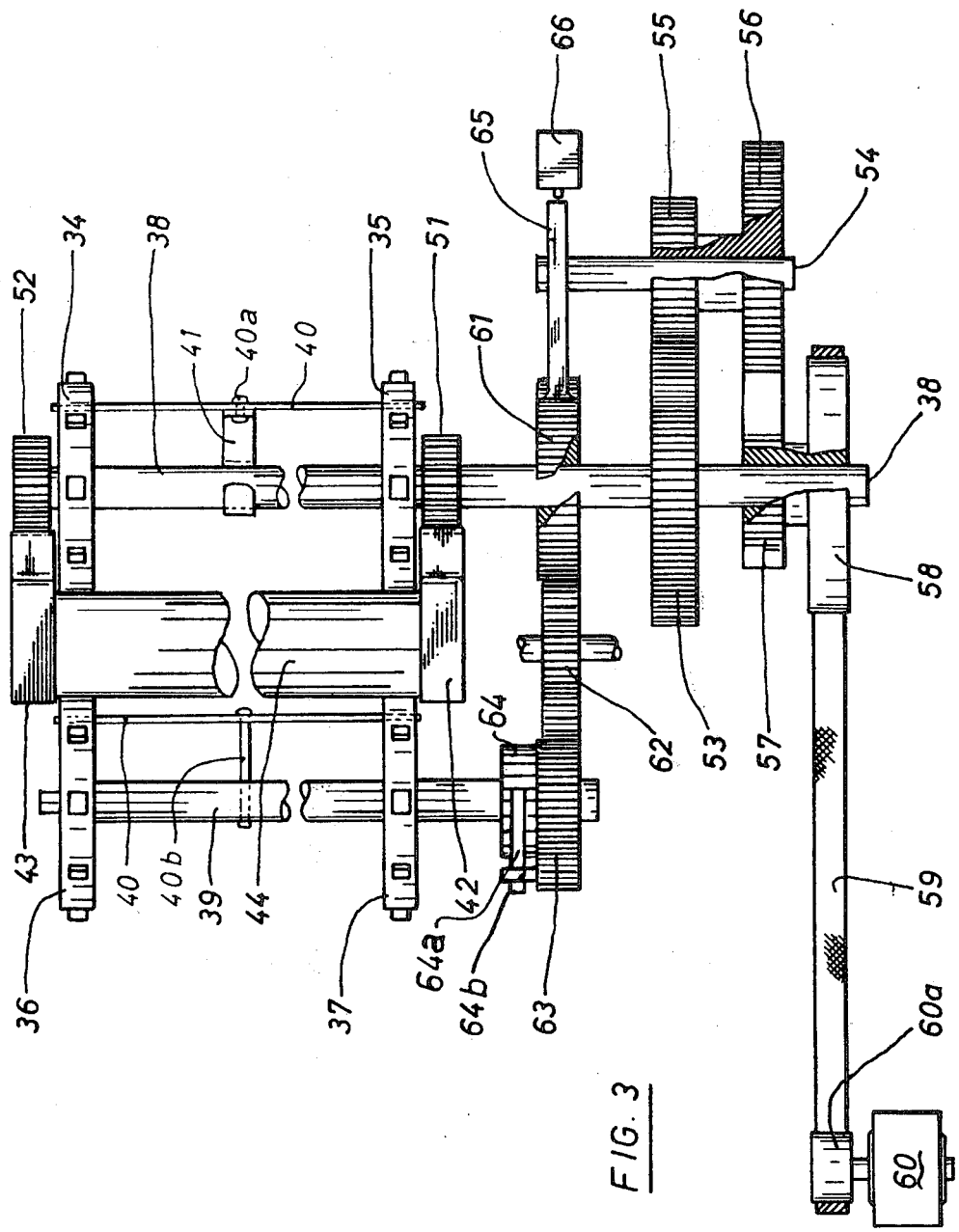
FIG. 3 shows schematically the drive member of the feed mechanism.

In FIG. 2, which represents on an enlarged scale the feed mechanism represented by the reference number 3 in FIG. 3, it may be seen that the film band 28 which has perforations on both edges is unwound from a feed spool 29 on a first film transport roller 30, a transport member 31, a second film transport roller 32, to end on a take-up spool which is not shown in FIG. 2 (see FIG. 4).

The two film transport rollers 30 and 32 are arranged in the same manner and each comprise a pair of toothed wheels 34, 35 and 36, 37, respectively, which engage with the teeth thereof in the perforations of the film 28. The toothed wheels of each of the transport rollers 30 and 32 are mounted on a spindle 38 and 39, respectively, and may slightly rotate relatively to this spindle.

The toothed wheels 34, 35 and 36, 37 of each pair are respectively connected to one another by means of a connecting member 40 (see likewise FIG. 3). The connecting member 40 is itself connected to a friction clutch 41 via a pin 40a allowing a slight reverse rocking movement between the toothed wheels 34 and 35. The clutch 41 is in frictional contact with the spindle 38, as is represented schematically in the FIGS. 2 and 3. The toothed wheels 36 and 37 likewise have a connecting member 40 similar to the member of wheels 34 and 35, this member being directly pinned to the spindle of the wheels 36 and 37 via a pin 40b, which likewise allows a slight reverse rocking movement of the wheels 36 and 37, but without frictional sliding of the spindle. This arrangement for connecting the wheels 36 and 37 is shown solely in FIG. 3.

The driving connection between the spindle or shaft 38 and the toothed wheels 34, 35 is interrupted by means of the friction clutch 41 from the moment when the pull on the film 28 becomes too great, so that deterioration of tearing of the film 28 is avoided. As the two toothed wheels 34, 35 and 36, 37 are respectively mounted freely on the spindles 38 and 39, and have a connecting member 40 which may pivot around the pivot 40a, the toothed wheels may be turned in opposite directions by a certain angle, the two wheels exerting the same tension on both sides of the film. Thus, errors in the manufacture of the film may be compensated.

The transport member 31 comprises two toothed rack uprights 42 and 43 parallel to each other, and spaced at a distance from one another, which extend perpendicularly to the plane of the film 28 and are connected at their upper end by a cylindrical roller 44 over which the film passes.

Between the toothed rack uprights 42 and 43 a pressure plate 45 for the film 28 is disposed, which is connected to a transverse bar 46, this bar 46 being itself connected to each of its ends to a lever 47 (a single lever is visible in FIG. 2). Each of the levers 47 is rotatably mounted at its lower end on a corresponding toothed rack upright 42 and 43 respectively and carries at its upper end a pin 48 which extends through a slot 49 provided in the toothed rack uprights 42, 43. The wall of the chamber 21 (FIG. 1) carries a cam 50 represented in dotted lines in FIG. 2. This cam is arranged to act on the pin 48.

As soon as the transport membe 31 is in its upper position, each of the pins 48 comes into contact with an inclined bearing surface of the corresponding cam 50 and the levers 47 with the plate 45 are pushed against the part of the film 28 which must be exposed, so that this part comes to bear against the mask 24 (FIG. 1). According to a variant which is not shown, the levers 47 which press the plate 45 against the film 28 so as to apply the said film against the mask 24, may be replaced by a single spring exerting a pressure on the film 28. As is explained further on in detail, the film 28 is unwound by the toothed-rack transport member 31 adjacent to the mask 24, so that no friction occurs between the sensitive side of the film 28 and the mask 24. This fact is an important advantage provided by the described device and permits, among other things, to press the film 28 against the mask 24 by means of a simple spring.

The feed mechanism for the film transport rollers 30 and 32 and for the transport member 31 will be described with reference to FIGS. 2 and 3. FIG. 3 is a schematic topview of the film feed mechanism shown in FIG. 2.

On the spindle 38 two toothed wheels 51 and 52 are fixed which respectively mesh with the toothed rack uprights 42 and 43 as well as another toothed wheel 53 which comes into engagement with a toothed wheel 55 rotatably mounted on a spindle 54. The toothed wheel 55 is in connection with another toothed wheel 56 rotatably mounted on the spindle 54, the toothed wheel 56 being in mesh with a toothed wheel 57 which is freely mounted on the spindle 38 and which is in connection with a wheel 58 also freely mounted on the spindle 38. A drive element 59 connects this wheel 58 and the shaft 60a of driving motor 60.

On the spindle 38 another toothed wheel 61 is rotatably mounted, which is not visible in FIG. 2 and which meshes with an intermediate toothed wheel 62 (also not visible in FIG. 2), the intermediate wheel 62 being in mesh with a toothed wheel 63 which is freely mounted on the spindle 39 and serves to drive the latter for rotation in one direction. Between the toothed wheel 63 and the spindle 39, a ratchet wheel 64 is arranged solid with the spindle and a pawl 64a is fixed to the wheel 63 by a pin 64b.

The toothed wheel 61 comprises a lever 65 which is mounted on the spindle 54 and which serves to control a switch 66, through which the motor 60 is switched off and through which the direction of rotation of the said motor is reversed.

FIG. 4 shows schematically the feed mechanism 3 seen from the side, the drive means not being shown.

In the FIGS. 5 and 6 a film retaining member is shown in a topview in the direction of the arrows A and B, respectively, in FIG. 4.

The transport member 31 is represented in dotted lines in FIG. 4 in its lower position (position of rest) and in full lines in its upper position (operative position).

The feed spool 29 has a wheel 67 on one side thereof, over which a tension member 68 extends, whereof one end is connected to a tension spring 69, the other end of the spring being connected to a fixed point of the housing 1.

The film 28 is wound off the feed spool 29, passes on the guide rollers 70, on the toothed wheels of the first transport roller 30, over the cylindrical roller 44 of the transport member 31, along the film pressure plate 45, and on the toothed wheels of the second transport roller 32 to reach the take-up spool 33.

Before the second transport roller 32, in the direction of displacement of film 28, a retaining member 71 is provided, which comprises a cylindrical body 72 rotating about its spindle 73. A tension spring 74 is fixed eccentrically to the body 72.

A plate 76 is mounted on the body 72 by means of a screw 75 (see also FIGS. 5 and 6), the plate 76 having two fingers 76a and 76b which come into position in the perforations of the film. The plate 76 is mounted so as to be able to pivot slightly around the axis of the screw 75. This pivoting movement allows the fingers 76a and 76b to enter into the perforations of the film 28, even when these perforations are longitudinally shifted.

To limit rotation of the plate 76, the body 72 comprises a pin 77 which extends with clearance through a hole 78 of the plate 76 (FIGS. 5 and 6).

A moment is applied to the body 72 and to the plate 76 via the spring 74, which moment presses the fingers 76a and 76b against the film 28 in the perforations of the said film.

The mode of operation of the mechanism for feed of the film 28 will be described below.

The mask 24 is exposed and developed, then reintroduced into the camera chamber 21 with the closing device and the frame 27, as has been described further above. The transport member 31 is in its lower position, wherein it is situated completely within the housing 1. The exit opening for the transport member 31 in the housing 1 is closed by a cover not shown in the figures of the drawing, in such manner that light cannot penetrate into the interior of the housing 1, because the device is not utilized in a dark room, as is the case for known devices.

To make the film 28 advance, the motor 60 is switched on to drive, via the drive element 59, the wheel 58 and the toothed wheel 57 in connection with the wheel 58. At the same time, the closing cover mentioned above and not shown in the drawing is opened. The toothed wheel 57 drives, via the two toothed wheels 55 and 56, the toothed wheel 53 which is fixed on the spindle 38 and causes it to rotate. The toothed wheels 51 and 52 as well as the toothed wheels 34 and 35 rotate with the spindle 38.

When the toothed wheels 51 and 52 are caused to rotate, they drive the toothed rack uprights 42 and 43 and the transport member 31 is brought into its high position.

The film band 28 is maintained by the retaining member 71, unwound from the feed spool 29 via the first transport roller 30 and passed against the mask 24 by the transport member 31.

The diameter of the toothed wheels 51 and 52 is slightly more than half the diameter of the toothed wheels 34 and 35 which are driven by the spindle 38 and which pull the film 28 so as to wind off the feed spool 29. The transport member 31 thus unreels the film 28 via the cylindrical roller 44 slightly more rapidly than the toothed wheels 34 and 35, so that the film is slightly stretched between the transport roller 30 and the retaining member 71.

If the resulting tension becomes too great, the friction clutch 41 goes into action as described further above, which has the effect of breaking the direct connection established by the friction member 41 between the spindle 38 and the toothed wheels 34 and 35, the said member 41 rotating on the spindle 38.

During unreeling of the film 28, the feed spool 29 rotates in the direction of the arrow C (FIG. 4). The tension member 68 driven by the wheel 67 stretches the spring 69. When the transport member 31 is displaced to reach its upper position between the shoulder of the frame 27, the portion of film to be exposed is placed along the mask 24. Yet there is no friction between the film 28 and the mask 24 when the transport member rises towards its high position, because the film is unreeled from the feed spool 29 against the mask 24, via the cylindrical roller 44, so that any damage of the sensitive layer of the film is avoided. On the other hand, the fact that the roller 44 unreels the film against the mask 24 avoids the formation of air pockets between the fillm and the mask, which are intimately applied against one another.

When the transport member 31 is situated in its high position, the film portion which must be exposed is pressed against the mask 24 by the plate 45, as described further above. It should now be explained that when the transport member 31 unreels the film 28 from the feed spool 29 against the mask at a slightly faster speed than the speed of unreeling imparted to the film by the toothed wheels 34 and 35, a tension is applied to the said film between the cylindrical roller 44 and the toothed wheels 34 and 35. Since the toothed wheels may pivot by an angle of a few degrees in opposite directions thanks to the connecting member 40 which connects the two wheels together and is pivotally mounted on the friction member 41, the tension applied to the film will be equal on both sides of the film, even if the perforations on both sides of the film should present some longitudinal shift or if the film were unreeled askew by the cylindrical roller. In all cases, an unbalance on one side of the film with respect to the other during unreeling of the film will be compensated by the pivotal connecting member 40 which joins together the two toothed wheels 34 and 35.

When the transport member has reached its high positon or operative position, it is blocked and the spindle 38 is likewise blocked therewith. The motor 60 is meanwhile still switched on and drives the two toothed wheels 55 and 56. As the toothed wheel 53 is still blocked also, the toothed wheel 55 rotates on this blocked toothed wheel 53 and drives the spindle 54. The spindle 54 in turn drives the lever 65, which causes the toothed wheel 61 to rotate. If the toothed wheel 61 rotates, the toothed wheels 62 and 63 also rotate. The ratchet wheel 64 meanwhile prevents that the rotating movement of the toothed wheel 63 is transmitted to the spindle 39.

As soon as the lever 65 comes into contact with the switch 66 and actuates it, the motor 60 is cut off and switched over in order to change the direction of subsequent rotation.

The diapositive 8 or the original 12 may now be photographed by means of the device for taking photographs through the mask 24 after having selected the adequate filter or filters.

In the normal case, one will carry out three separations through red, blue and green filters and a black separation. These four separations will be effected through the diapositive 8, a negative mask 24 being placed in the chamber 21. If the quality of the diapositive is poor and one must use the colour correction mask 9, each of the separations will be achieved by illuminating the disapositive from behind with a flash bulb not shown, then by illuminating the colour correction mask also from behind by means of the same flash bulb after having caused the frame 7 to pivot and both illuminations take place on the same film portion for each separation. A variant, if one does not dispose of the device 6 allowing the diapositive and the colour correction mask to be alternately presented in the path of the light rays of the camera, will consist in making a colour correction mask which will be placed against the device 22 in the chamber 21. In this case one will carry out four separations (red, blue, green and black) without the mask and four other selections with the colour correction mask. It is sufficient to then superimpose the separations in the projector when carrying out half-tone reproductions. One will not go here into all details of the operations necessary for carrying out good separations from dispositives of bad quality. If suffices to know that all the operations which are carried out in photographic studios may be carried out with the apparatus just described with reference to FIGS. 1 to 6 as well as with the preferred embodiment which will be described further below.

After a separation has been made, the motor 60 is once more switched on and it drives the spindle 38 as is explained above but in the opposite direction. The transport member 31 is thus displaced from its high position or operative position to its low position or position of rest, and the film is driven against the feed spool 29 by means of the transport roller 30, under the action of the spring 69 which causes the spool to rotate in the direction of the arrow D (FIG. 4) so that the film is rewound onto the feed spool 29. The exposed portion of the film 28 is thus withdrawn from the mask 24 without friction between the film and the said mask 24.

When the transport member 31 has reached its low position or position of rest, the spindle 38 and the toothed wheel 52 are blocked once more. Still driven by the motor 60 which remains switched on, the toothed wheel 55 rotates on the toothed wheel 53, which provokes movement of the lever 65 and causes the toothed wheels 61, 62 and 63 to rotate. At the same time, the closing cover of the housing 1 is closed.

In the direction of rotation in which the toothed wheel 63 can rotate, the spindle 39 and thus the toothed wheels 36 and 37 are made to rotate by means of the ratchet wheel 64. The film portion previously rewound onto the feed spool 29 is withdrawn from the said spool 29 and wound onto the take-up spool 33. The switch 66 is controlled by the lever 65, the motor 60 is cut off and its direction of rotation reversed.

If the motor 60 is switched on once more, an unexposed portion of the film 28 will be brought against the mask described further above and a new operating cycle may commence.

If the film 28 exposed after developing is driven by a feed mechanism similar to that of the device previously described, it will be possible to register, by means of the perforations, exactly the same positions of each of the images of the same selection.

With the device just described, it is possible to carry out all the operations which are necessary for obtaining colour selections in a simple and practical manner. These operations may be carried out in artifical light or in daylight and it is not necessary to have a dark room for carrying out the selections.

Figure 9:
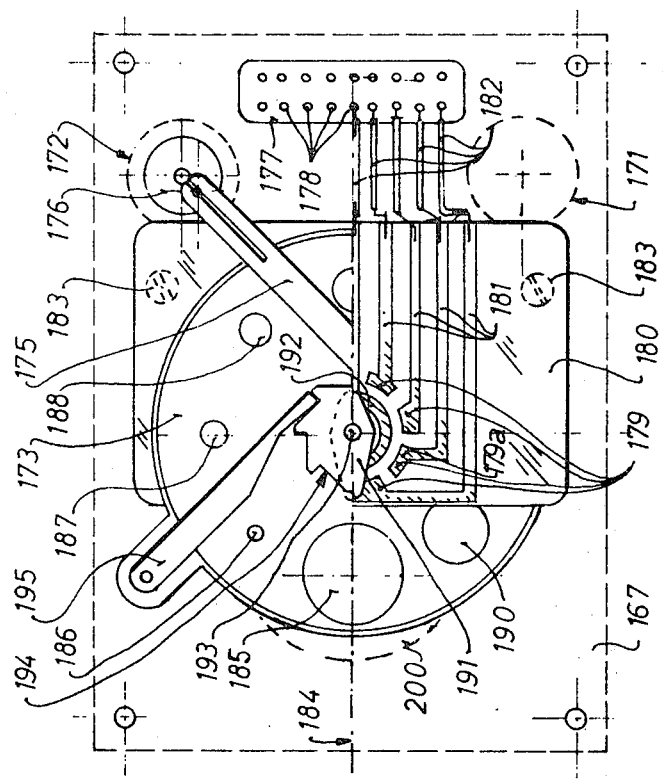
FIG. 9 is a view of a mechanism for controlling one of the discs, seen in the direction of arrow C in FIG. 8.
Figure 10:
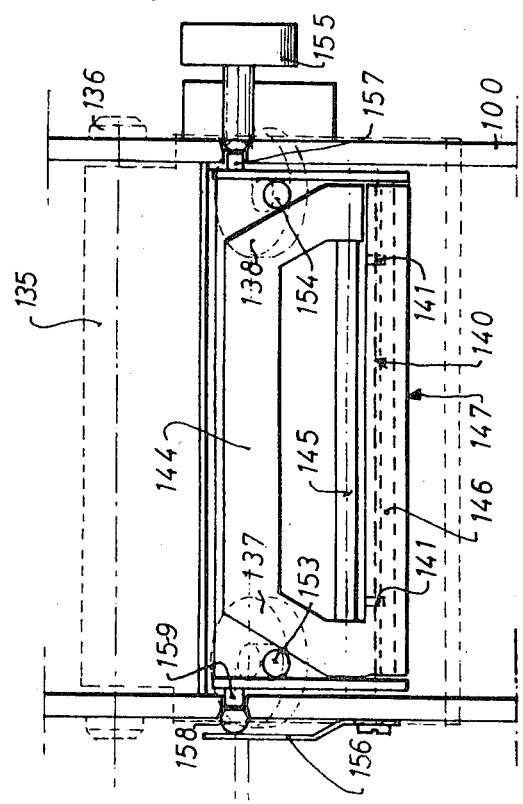
FIG. 10 is a topview of a shutter device carrying the mask, seen in the direction of arrow D in FIG. 7.
Figure 11:
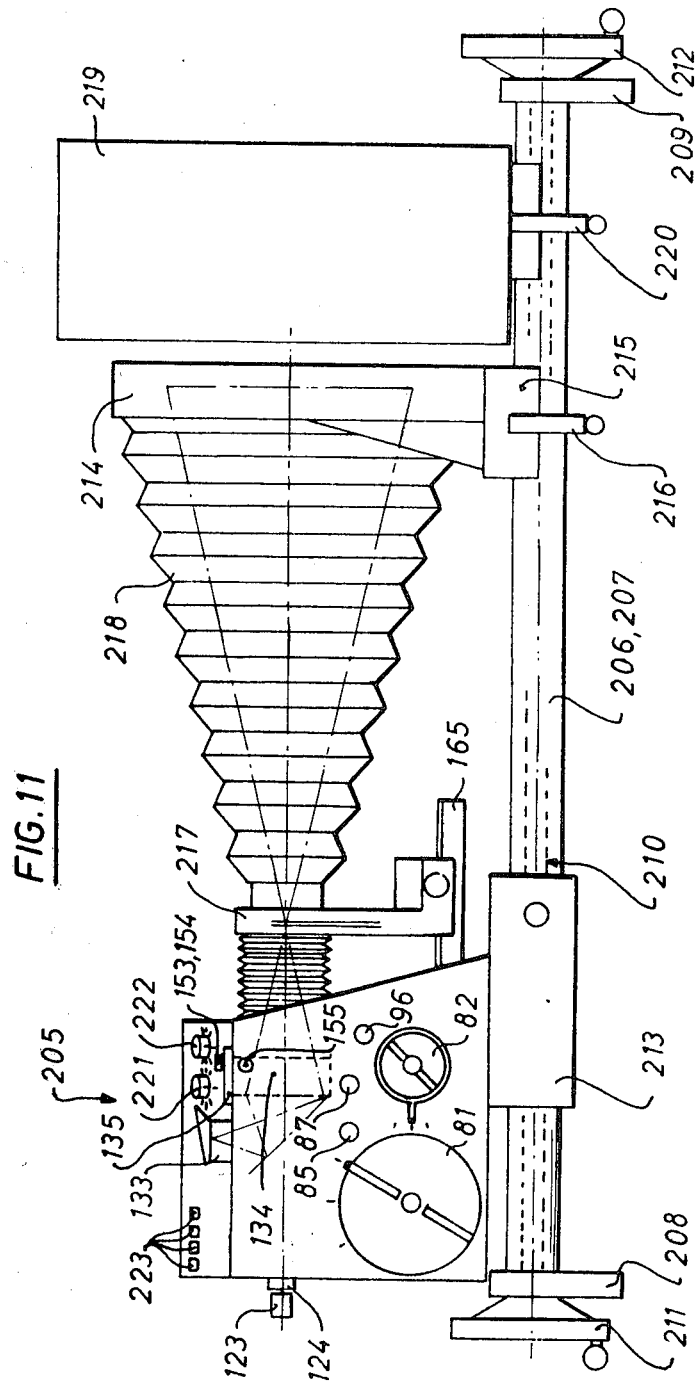
FIG. 11 is a side view showing a preferred utilization of the device, described with reference to FIGS. 7 to 10, for recording from a transparency placed between two glass plates and illuminated by a flash bulb.

The device shown in FIGS. 7 to 11 comprises a lower housing 80 containing a magazine 81 for a feed spool 82. A film 83 is unreeled from the feed spool 82, leaves the magazine 81 via an opening, passes under a feed roller 85, over a cylindrical roller 86 then under a receiving roller 87, to penetrate into a magazine 88 through an opening 89 and wind onto a take-up spool 90. The magazines 81 and 88 containing the spools 82 and 90 are each turned of two concentric cylinders 91, 92 and 93, 94, respectively, the inner cylinders 92 and 94 rotating within the outer cylinders 91 and 93 of each magazine, in such manner as to permit closing and opening the apertures 84 and 89. Above the magazine 88, a film cutter 95 is disposed to slide along an axis 96. As soon as a separation has been achieved, the film cutter 95 is actuated to cut the film 83, the inner cylinder 94 is rotated relatively to the outer cylinder 93 to close the opening 89 and the magazine 88 may be taken out of the lower housing 80. Control of the closing movement of the slots 84 and 89 of the magazines 81 and 88 is effected by means of the end covers of the said magazines. These covers are represented in FIG. 11 wherein it may be remarked that the covers may assume three positions indicated by indices. In one of the extreme positions, the slot 84 and 89, respectively, is opened, in the middle position the slot is closed, and in the other extreme position the magazine 81 and 88, respectively, may be withdrawn from the housing 80.

The cylindrical roller 86 is rotatably mounted at the top of a toothed rack member having two uprights 98 and 99 sliding in the grooves, not shown, of the housing 80 to bring the film band 83 into an upper housing 100 situated above the lower housing 80. Between the two uprights 98 and 99, a bearing plate 101 is places which will press the film against a bearing surface of the housing 100 when the toothed rack transport member 97 is in its operative position or high position, due to the action of a spring 102 fixed to the member 97.

The toothed rack transport member 97 is controlled by the same elements and operates in exactly the same manner as the member 31 described with reference to FIGS. 1 to 6. On the other hand, the feed roller 85 and the receiving roller 87 are respectively constructed in exactly the same manner as the rollers 30 and 32 described with reference to FIGS. 1 to 6, and operate in the same manner. Thus, the rollers 85 and 87 have two toothed wheels penetrating into the perforations provided on both sides of the film and are pivotally connected so as to be able to turn in opposite directions by a few degrees for compensating the errors in perforations of the film and applying the same tension on the two sides of the said film, whatever the position of the film in the device may be. The feed roller 85 has in addition the friction clutch described with reference to the roller 30 of FIGS. 2 and 3.

In the upper part of the housing 80, a cover 103 may be mounted which slides backwards and is connected to a frame 104 mounted on the upper housing 100 so as to be able to move backwards while driving the cover 103. The displacement of the frame 104 will be explained further on. When the cover 103 is open, the rack member 97 can rise vertically and bring the film 83 to the axis of the device for exposure.

The frame 104 has the form of two reclining L-shaped profiles sliding horizontally in the upper housing 100 due to two rails 105 guided by grooved wheels 106 disposed on both sides of the housing 100. The backward movement of the said frame 104 is controlled by a shaft 107 driving a bent part 108 via an arm 109, one end of the part 108 being pivotally mounted on the frame 104. Rotation of the shaft 107 which is connected to the motor of the device by means not shown, causes the frame 104 to move backwards, the said frame 104 driving in a backward movement the cover 103 which is fixed to the frame 104 by means of a pin 110. The two L-shaped profiles constituting the frame 104 and placed adjacent to the two lateral walls of the upper housing 100 carry a frame 111 for supporting a frosted glass 112 with the assistence of two pins 113 maintained by springs 114.

The frame 104 supports two lateral uprights 115 against which a mirror 116 bears, that is retained on each side in a position inclined at 45° by angular parts 117 and spings 118 fixed to its respective lateral upright by a screw 119. The frame 104 finally has a lateral upright 120 supporting two concentric rods 121 and 122 which may be cuased to rotate separately by control buttons 123 and 124. The outer rod 121 passes through the housing 100 through a ring 125 wherein it may slide when the upright moves backwards with the frame 104. The inner rod 122 solidly connected to an arm 126, at the end of which a second arm 127 is pivotally mounted, carrying a photo-electric cell 128. The outer rod 121 is solid with a toothed wheel 129 in mesh with a second toothed wheel 130 freely mounted on the pivot 131 connecting the two arms, this second tooth itself being in mesh with a third toothed wheel 132 solid with the arm 127. It is immediately apparent that it is possible, through the two control buttons 123 and 124, to displace the cell 128 over the whole surface of the frosted glass 112 and to stop the said cell at any point of the frosted glass surface to measure the light intensity at that point.

Above the frosted glass 116 an eye-piece 133 is placed permitting the image to be seen which is formed on the frosted glass 112 and reflected by the mirror 116. It is to be remarked that the user sees in the eye-piece the cell 128 as well as all the control members 126 to 132. Focussing of the image formed on the frosted glass 112 as well as adjustment of the light intensity at various points or adjustment of the device with regard to the light intensity may be effected without difficulty. It may be readily seen that when the shaft 107 is made to rotate to cause the frame 104 to move backwards, all the elements fixed on the said frame, particularly the frosted glass 112, the mirror 116, the control rods 121, 122 of the cell 128 with the arms 126 and 127 move backwards with the frame 104 to make place for the toothed rack member 97 which rises to present the film 83 to the light rays of the device.

The front end of the housing 100 comprises a chamber 134 closed off by a cover 135 fixed to the housing by a hinge 136. The cover 135 has (see also FIG. 10) two adjusting screws 137 and 138 which allow positioning of a shutter device 139 presenting a bearing surface in the form of a frame and intended to receive either the film 83 unreeled against the bearing surface by the rack member 97, or a negative mask fixed against the bearing surface 140 by means of two positioning pins 141 as shown in the embodiment of FIG. 1 where the shutter device bears the reference number 22, the bearing surface the reference number 23 and the mask the reference number 24. In the FIGS. 7 and 10, the mask which is to be applied onto the bearing surface 140 is not shown. The shutter device further comprises two vertical closing shutters 142, 143 and an upper handle 144 pivotally mounted on the device 139 by means of a pin 145, the handle allowing the device 139 to be introduced and taken out of the chamber 134. On the upper part of the device 139 there is also provided adjacent to the pin 145 of the handle 144, a second pin 146 maintaining a plate 147 which may be brought down on the positioning pins 141 to maintain the mask, not shown (see FIG. 10), in place against the bearing surface 140.

It can also be remarked in FIG. 7 that the shutter device 139 is suspended in the chamber 134 by two fingers 148 placed on either side of the device 139, the two fingers 148 coming to be placed in notches 149 of two flexible blades 150 fixed by means of two screws 151 and 152 on the sides of the upper housing 100. In FIG. 7, a single blade 150 is shown. Yet it is understood that two blades are provided on either side of the housing 100, each of the blades 150 receiving a finger 148 in its respective notch 149. When the cover 135 is closed, the two ends of the adjusting screws 137 and 138 (FIG. 7 and 10) come to bear on cylinder 153 and 154 respectively mounted on the upper surface of the shutter device. It is thus possible to use the screws 137 and 138 to position the device 139 by displacing it vertically by turning the screws against the action of the blades 150, it being understood that the displacement may be indenpandantly effected on both sides of the device.

It may further be remarked in FIG. 10 that lateral positoning of the device 139 is provided by means of a third adjusting screw mounted on one side of the upper housing 100 and acting against the action of a spring 156 on the other side of the housing. The screw 155 acts in the device 139 through a cylinder 157 while, on the other side of the device 139, a ball 158 is placed between the spring 156 and a cylinder 159 fixed to the device 139. Finally, the device 139 rests at the bottom of the chamber on a finger 160 (FIG. 7).

With the three screws 137, 138 and 155, it is possible to exactly position the mask, not shown, held by the positioning pins 141 relatively to the image which is formed on the frosted glass 112 from the transparency to be reproduced.

Bellows 161 connect an objective 162 mounted on an objective-carrier 163 arranged for displacement by means of an adjusting screw 164 on a toothed rack rail 165 fixed to the lower housing 80. The objective 162, which comprises a disc for the filters and a disc for the diaphragm openings is described with reference to FIGS. 8 and 9.

In the FIGS. 8 and 9, which respectively represent a section through the objective and a topview of the control of one of the discs, a back supporting plate 166 may be mounted against which the bellows 161 are applied and a front plate 167 maintained together by an upper distance-piece 168. At their lower end, the plates 166 and 167 are fixed to the support 163. The plate 167 has two housings 169, 170 for receiving a motor 171 and 172, respectively, arranged to drive two discs 173 and 174, respectively, by means of a driving rod 175 connected to an eccentric 176 fixed to the axis of the motor 172. In FIG. 8, only the drive of the disc 173 has been represented. Yet it is evident that the second motor 171, which is in front of the motor 172 in FIG. 8 and drives the disc 174, has the same driving members as the motor 172. A multiple contact plug 177 connected to the control means, not shown, is fixed on the plate 167 between the two motors 171 and 172. All the upper contacts 178 of the plug 177 are connected to the conducting areas 179 of a printed circuit 180 by means of conducting bands 181 on the printed circuit and electric wires 182 (FIG. 9). The printed circuit 180 is fixed on the plate 167 by means of two screws 183. In FIG. 9, the printed circuit 180 is partially sectioned along the axis 184 in order to be able to represent the disc 173 which is the diaphragm disc and consequently has a viewing aperture 185 and apertures 186 to 190 of different diameters corresponding to the diaphragm openings normally used in photography. The part of FIG. 9 below the axis 184, which shows the printed circuit 180 (see also FIG. 8), a cursor 191 may be seen which rotates with the disc 173 and is shown in FIG. 9 in a position wherein its long axis coincides with the axis 184. When this cursor rotates with the disc 173, it establishes electric contact with each of the areas 179 of the printed circuit and with a circular area 192 concentric with the axis 193 of the disc 173.

Under the cursor 191 and the printed circuit 180, a toothed wheel 194 and the disc 173 are situated as is shown above the axis 184 in FIG. 9. Like the cursor 191, the toothed wheel is solid with the disc 173 and caused to rotate step-by-step by the driving rod 175 which is applied to one tooth of the toothed wheel 194 at each revolution of the motor 172. A retaining pawl 195 serves to prevent the toothed wheel 195 from returning backwards when the driving rod 175 moves backwards on the wheel to come into engagement with the following tooth. Thus, at each revolution of the motor, the toothed wheel advances by one tooth width, to which a following opening position of the diaphragm of the disc 173 corresponds.

The arrangement of the filters described above comprises electromechanical means, not shown, for selecting a given diaphragm opening. It will be assumed that one wishes to preselect the diaphragm opening 187 (FIG. 9) to which corresponds the conductive area 179a of circuit 180 opposite to the aperture 187, the aperture having to come into the position occupied in FIG. 9 by the viewing aperture 185. Control of positioning the opening of the diaphragm 187 starts the motor and switches on an electric circuit, not shown, which applies voltage to the area 179a of the circuit 180. The motor causes the disc 173 to rotate until the cursor 191 reaches the area 179a. The cursor now establishes electric contact between the areas 179a and the circular area 192 at the axis 193 of the disc, this contact being used to stop the motor 172, e.g. by means of a relay, not shown. When the motor is stopped, the aperture 187 is in position. As one area 179 corresponds to each aperture of the disc 173, it is possible to select each of the apertures by means of control buttons which are not shown in the FIGS. 7 to 10.

The disc 174, which is the filter disc and normally comprises a series of blue, green, red, magenta, olive-green and orange filters, as well as a viewing aperture similar to the viewing aperture 185 of the diaphragm disc 173 and two reserve apertures which can receive special filters for particular jobs, is driven and functions in the same manner as the diaphragm disc 173. In FIG. 8 one may observe the printed circuit 196 corresponding to the filter disc 174, the axis of rotation 197 of the disc 174 with the cursor 198 and the electrical connections going from the printed circuit 196 to the lower row of the contacts 199 of the plug 177.

Sets of lenses 200 and 201 are fixed to the plates 167 and 166 by rings 202 and 203. It may be remarked that the discs 173 and 174 are placed approximately at the place where the light rays passing through the objective constituted by the sets of lenses 200 and 201 intersect.

The photographic device described above with reference to FIGS. 7 to 10 is depicted by 205 in FIG. 11, where it is mounted on a frame formed of two parallel tubes 206, 207 connected together at their ends by cross-pieces 208 and 209 resting on a tble which is not shown. A threaded rod 210 parallel to the tubes 206, 207 and having cranks 211 and 212 respectively arranged at each of their ends allows displacement of the device 205 mounted on a sliding support 213 through which the tubes 206, 207 and the threaded rod 210 pass.

On the two tubes 206 and 207 an original holder or a transparent colour film from which the separations are to be taken is maintained between two glass plates. The original holder 214 is placed on a support 215 fixed on the two tubes 206, 207 by means of a fast-coupling strap 216 and is connected to the objective 217 by bellows 218. Behind the original holder there is a light generator 219 containing a Xenon discharge (flash) tube and a halogen focussing lamp, not shown. The light generator 219 is also fixed on the two tubes 206, 207 by means of a rapid coupling 220.

On the device 205 for obtaining separations, there may be remarked the magazines 81 and 82 of the feed and take-up spools with their three positions as explained above with reference to FIG. 7, as well as the exists of the spindles of the feed and take-up rollers 85 and 87 and of the film cutter 96. In FIG. 11 there may further be remarked the control buttons 123 and 124 of the photo-electric cell for measuring the intensity of the flash, the viewing ocular 133, the cover 135 of the chamber 134 of the shutter device 139 with the adjusting screws 137, 138 and 155, as well as the buttons for preselection of the filters and of the openings of diaphragm 221 and 222, respectively, and control buttons for controlling and adjusting the flash, automatic measurement by means of the cell, feed of the film etc.

The device described with reference to the FIGS. 7 to 11 operates as follows:

The original colour transparency from which separations are to be obtained in placed between the two glass plates [which are not shown] of the original holder 214, the magazines 81 and 82 containing film having previously been placed in position. The original holder 214 and the light generator 219 are displaced along the tubes 206, 207 and the objective 217 is appropriately positioned on the rail 165 until the original or the portion of the original from which separations are to be obtained is framed in the device 205. To this end, the halogen lamp of the light generator 219 is lit, the filter and diaphragm discs are positioned on the viewing aperture and the necessary adjustments are made by looking through the eye-piece 133. An unexposed film is set against the shutter device 139 in the chamber 134 and this film is acted on to produce the negative mask, after having previously adjusted the flash of the light generator and chosen the adequate diaphragm. The shutter device 139 is then withdrawn from the chamber 134 and the negative mask is developed and put back in place. If adjustment of the position of the shutter device 139 is necessary, it will be carried out by means of the three screws 137, 138 and 155, so as to make the mask and the image of the original formed on the frosted glass 112 (FIG. 7) of the device 205 to coincide exactly. The appropriate filter for the first separation is then put in position and adjustment of the flash and/or the diaphragm is effected. The film is then mounted by means of the control buttons 223, the said film being unreeled without friction on the back of the shutter device 139 under the thrust of the rack member 97 after the frame 104 (FIG. 7) has carried out its movement backwards with the cover 103 due to the action of the shaft 107. The film being in place, the separation may be made.

It is to be noted here that all the adjustments including that of the light intensity may be controlled in the eye-piece 133. As the photo-electric cell may be displaced over the whole surface of the frosted glass 112, it will be possible to carry out an average adjustment of the light intensity by measurements at different points.

When the original transparency is of very poor quality and it is necessary to utilize a colour correction screen or mask, this mask will be produced in the same manner as the negative mask, i.e. by placing it against the shutter device 139 in the chamber 134. A second set of separations will then be made with the colour correction mask and one will superimpose these separations for carrying out half-tone work.

The device described above make it possible to effect automatically and precisely the most complicated and sophisticated operations which are normally effected by hand for high quality work in photographic studios. The film feed effected by means of the toothed rack member 97 described in detail in FIGS. 2 to 6, during which the film is unreeled under constant tension and without friction against the shutter device or against the mask applied to the shutter device, allows the separations to be exactly superimposed without taking any precautions, whereas in the prior art all these registers and superimpositions are made by hand and take considerable time.

For subsequent half-tone work, it will thus be possible to put the separations in register and to superimpose them without any adjustment.

In the examples given above, the described devices are utilized to obtain separations from a transparent colour film (diapositive, ektachorme, etc). It should be noted that this utilization is not the only one. It is also possible, for example, to utilize the devices described with reference to FIGS. 1 to 11 as a camera for taking photographs as long as the subject to be photographed is motionless. In that case, the device will be mounted on a stand and the separations besides, possibly, the negative mask will be made directly from an original object, such as a building, a hall, an automobile etc. In the case of such an utilization, a single important precaution must be taken. This consists in ensuring that the device utilized as a camera for taking photographs remains perfectly motionless with respect to the object during the whole operation of taking the separations.

What is claimed is:

1. An apparatus for photographic recording from transparent colour film or a real subject, comprising:
   a camera including an optical system for image projection along an optical axis and first housing means having a cavity with a first opening adapted to receive selected portions of a photographic film band for exposure thereof perpendicular to said axis;
   a feed mechanism which is mounted between a film feed spool and a film take-up spool in second housing means having a second opening arranged contiguous to said first opening and which comprises a film transport member arranged for displacement in a direction perpendicular to said optical axis between a position of rest and an operative position wherein said transport member is respectively placed in said second housing means and in said cavity of said first housing means, said transport member including a film support means having a bearing surface and said feed mechanism being arranged in such a manner that said film band is unreeled under constant tension from said feed spool while said selected film positions are maintained in contact with said support means during said displacement whereby said film portions are selectively brought into said operative position to allow exposure thereof in said cavity and are returned to said housing after exposure; and
   a feed roller assembly arranged between said feed spool and said transport member and a receiving roller assembly arranged between said transport member and said take-up spool, each of said roller assemblies having a pair of toothed wheels arranged to respectively engage in perforations provided along both edges of said film band and means for connecting the toothed wheels of each said pairs in such a manner as to allow slight rotation thereof in opposite directions.

2. An apparatus according to claim 1 wherein said connecting means comprise a transverse bar penetrating with clearance in openings in the toothed wheels of each said pair and a first common spindle on which the wheels of each said pair are pivotally mounted.

3. An apparatus according to claim 2 wherein the means connecting the pair of toothed wheels of said feed roller assembly comprise a friction clutch rotatably connecting the toothed wheels of said pair via said common spindle thereof.

4. An apparatus according to claim 3 comprising a drive mechanism adapted to drive said common spindle at a slightly lower speed than the unreeling speed of said film band.

5. An apparatus according to claim 3 wherein said friction clutch is a spring wound around said common spindle and said transverse bar being pivotally mounted on the free end of said spring.

6. An apparatus according to claim 4 wherein said transport member comprises two parallel elements which are arranged for common displacement in and out of said housing perpendicular to the general feed direction of said film band and to said optical axis of the camera and which are joined together by a transverse roller for passage of said film band over said transverse roller.

7. An apparatus according to claim 6 wherein said parallel elements are toothed racks in mesh with toothed wheels mounted on a first drive spindle connected to said drive mechanism.

8. An apparatus according to claim 7 wherein said first drive spindle serves to simutaneously drive said toothed racks and said pair of toothed wheels of said feed roller assembly via said common spindle and said friction clutch.

9. An apparatus according to claim 8 wherein the pair of toothed wheels of said receiving roller assembly are driven by a second drive spindle connected to said drive mechanism.

10. An apparatus according to claim 9 wherein said drive mechanism is arranged to rotate said second spindle so as to wind said film band onto said take-up spool after said transport member has been displaced from the said operative position to the said position of rest.

11. An apparatus according to claim 10 wherein said feed spool is arranged for rotation so as to reel in the film during displacement of said transport member from the said operative position to the said position of rest.

12. An apparatus according to claim 1 comprising a film retaining member arranged to engage in the perforations of said film band before said receiving roller assembly.

13. An apparatus according to claim 1 wherein said transport member comprises support means having a bearing surface adapted to support said selected film portions during said displacement of the transport member.

14. An apparatus according to claim 13 wherein said transport member comprises a pressure place for pressing said film band against said bearing surface.

15. An apparatus according to claim 1 comprising an objective lens of said optical system and means for positioning filter disc means at the intersection of the light rays passing through said objective lens.

16. An apparatus according to claim 15 comprising a disc having diaphragm apertures, arranged adjacent to said filter disc means.

\* \* \* \* \*